United States Patent [19]

Marks

[11] Patent Number: 5,801,458
[45] Date of Patent: Sep. 1, 1998

[54] DIRECT CURRENT CONTROL CIRCUIT

[76] Inventor: Walter Marks, Buchsweg 2, 74653 Kunzelsau, Germany

[21] Appl. No.: 640,779

[22] PCT Filed: Apr. 12, 1995

[86] PCT No.: PCT/EP95/01371

§ 371 Date: Jul. 23, 1996

§ 102(e) Date: Jul. 23, 1996

[87] PCT Pub. No.: WO95/28767

PCT Pub. Date: Oct. 26, 1995

[30] Foreign Application Priority Data

Apr. 19, 1994 [DE] Germany ............... 44 13 546.7

[51] Int. Cl.[6] ........................................... H01H 47/22
[52] U.S. Cl. ..................... 307/131; 307/104; 307/125; 327/110; 361/152; 361/156; 257/161
[58] Field of Search ........................... 307/131, 125, 307/116, 104, 108; 327/110, 365; 318/376; 361/111, 152, 156; 363/96; 257/161

[56] References Cited

U.S. PATENT DOCUMENTS

| | | | |
|---|---|---|---|
| 3,748,560 | 7/1973 | Sawa et al. | 318/376 |
| 4,186,418 | 1/1980 | Seiler | 361/111 |
| 4,746,813 | 5/1988 | Disser . | |
| 4,903,188 | 2/1990 | Madhavan et al. | 363/96 |
| 5,390,070 | 2/1995 | Niedermeier | 361/152 |
| 5,532,526 | 7/1996 | Ricco et al. | 361/152 |

FOREIGN PATENT DOCUMENTS

| | | |
|---|---|---|
| 0493185 | 1/1992 | European Pat. Off. . |
| 0554154 | 8/1993 | European Pat. Off. . |
| 2257855 | 1/1993 | United Kingdom . |

*Primary Examiner*—William M. Shoop, Jr.
*Assistant Examiner*—Albert W. Paladini
*Attorney, Agent, or Firm*—Browdy and Neimark

[57] ABSTRACT

A control circuit for turning off or on direct current flowing through an inductive load (12) to ground uses a semiconductor switch (11), for example a MOSFET, having a first input terminal (D), a control terminal (G), and a second output terminal (S) to the load. A semiconductor freewheel diode (16) is coupled between the switch second terminal and ground, in parallel with the load. The freewheel diode has a current-conducting state and a current non-conducting state. A switching-off current source (19) is coupled between the second terminal and the control terminal; it reduces the magnitude of the switching control current ($\pm I_{GS}$) flowing into the control terminal of the MOSFET, as a function of voltage at the second terminal of the switch and the input to the freewheel diode. A minimum value ($\pm I_{GSmin}$) of the switching control current is reached when the voltage at the second terminal of the switch reaches ground potential. The current-increase or current-decrease time intervals are influenced by the current sources 18 and 19 in response to the freewheel voltage causing rapid switching without spikes and power loss.

17 Claims, 2 Drawing Sheets

DIRECT CURRENT CONTROL CIRCUIT

FIELD OF THE INVENTION

The invention relates to a direct current control circuit for turning on and off the flow of current in an inductive load power circuit by the control of a semiconductor switch.

REVIEW OF THE RELATED TECHNOLOGY

For switching direct current on and off the conventional arrangement is one including a series circuit arrangement with a power source, a semiconductor switch and a consumer or load. In the case of inductive loads a freewheel diode is placed in circuit parallel to the inductive part of the power circuit, this inductance being possibly also for example due completely or partly to the conductors of the power circuit.

A semiconductor switch in the form of a MOSFET for instance is controlled with the aid of the GATE-SOURCE voltage. As long as such a transistor is conducting, then essentially the supply potential will be present at the connection point between the transistor and the load—and accordingly also at the freewheel diode. If now the GATE-SOURCE voltage is reduced to turn off the transistor, the internal resistance of the transistor will increasingly rise and the power converted into heat will also become greater and greater, since owing to the action of the inductance of the load power circuit the current will only be reduced a small amount. It is therefore necessary for the flow of current to be switched through the freewheel diode before the transistor develops so much heat that it is damaged.

For this purpose the German patent publication 4,013,997 A1 discloses holding a switch off control current for the GATE of the transistor at a high value until an evaluating circuit indicates that the freewheel diode is near the switching point. The control current is now switched over to a lower value. Although this measure means that the undesired effects occurring on switching over are substantially avoided, namely power dissipation at the transistor and the production of interfering voltages and interfering pulses, the maximum switching rate is limited because on increasing the DRAIN-SOURCE voltage and then simultaneously reducing the effective GATE-SOURCE capacity of a MOSFET the switching off operation is accelerated and because of this the maximum switching off current can only be selected to be so large that timely switching over to the lower switching off current near the switching point of the diode is still possible.

On switching on the current another problem occurs that is to say the danger of short circuiting. If switching off took place only just prior to switching on again, the current will still be flowing in the load power circuit through the freewheel diode. If the resistance of the transistor drops with an increasing GATE-SOURCE voltage for switching on the transistor, then the potential at the connection point between the transistor and the freewheel diode will become positive so that the diode is turned off. However such turnoff will not take place immediately so that there is a danger that on increasing the GATE-SOURCE voltage of the transistor the same will already be fully conducting, if the diode is not yet turned off. This will obviously lead to a short circuit accompanied by the danger of damage to the transistor and/or the diode.

In order to prevent this there has already been a suggestion in the said German patent publication 4,013,997 A1 to firstly hold the control current at a low level or—in the case of the use of bipolar transistors—to only cause it to increase at a slow rate until the evaluating device has detected switching of the freewheel diode. It is only then that the control current is switched over to a substantially higher value. While this means effective prevention of a short circuit, with the constant turn off current provided in this case the GATE-SOURCE voltage of the transistor will be continuously increased. If same exceeds the trip voltage of the transistor then current will increasingly flow through the same. Accordingly the current through the diode will be reduced and owing to a further increase in the DRAIN-SOURCE current the current through the diode will be reduced until same is free of current. Since current is flowing through the transistor and simultaneously the full supply voltage drops across it, in this part of the switching operation there will be a high power dissipation, which the transistor must convert into heat.

SUMMARY OF THE INVENTION

One object of the present invention is to so further develop the known direct current control circuit that on switching the current on and/or off there is less power dissipation and simultaneously more rapid switching operations, interfering voltages and interfering pulses being substantially avoided.

This aim is to be achieved by the invention because a switching on and switching off current source is provided adapted to be controlled in manner dependent on the voltage at the freewheel semiconductor component or a parameter dependent thereon for the continuous reduction of the amount of the switching on or, respectively, switching off current as far as a minimum value, the minimum value being reached essentially at a voltage value of 0 volts of the decreasing voltage at the freewheel semiconductor component.

Since in the direct current control circuit of the invention on switching off the direct current the switch off current is not reduced in one step but rather continuously in a manner dependent on the reduction of the turnoff voltage of the freewheel semiconductor component, which must switch on when the semiconductor switch is switched off, near the switching point of the freewheel semiconductor component the switch off current will have reached a value which ensures switching with minimum power dissipation and interference power. The turnoff current may be selected to be substantially larger than in the known control circuit, because firstly only the GATE-SOURCE voltage is reduced, without however any substantial change occurring in the DRAIN-SOURCE voltage. If the DRAIN-SOURCE resistance of the transistor is however so great that the DRAIN-SOURCE voltage increases owing to the current flowing through the transistor and accordingly the turnoff voltage of the freewheel semiconductor component becomes smaller, then accordingly the switching off current will be so reduced in a manner proportional to the turnoff voltage of the diode that the diode will have sufficient time near the switching point for its switching on procedure. Accordingly there will generally be a higher switching rate.

In the invention in a manner analogous to switching off, on switching on as well an initially high switching on current is reduced in a manner dependent on the voltage at the freewheel semiconductor component continuously until such current reaches the necessary low minimum value of the control current near the switching point of the freewheel semiconductor component. Accordingly the freewheel semiconductor component is provided with the necessary switching time in order to prevent the otherwise unavoidable occurrence of interference power. Since the freewheel semiconductor component is very rapidly brought into the proximity of the switching point, the time, in which there is high power dissipation in the transistor, before the freewheel semiconductor component is near the switching point, will be substantially reduced. This means that there is a reduction not only of the switching time but also of power dissipation with a low interference power.

The measures recited in the dependent claims constitute advantageous further developments and improvements in the direct current control circuit defined in claims 1 and 5.

It is an advantage if the switching on current source and the switching off current sources possess limiting means in order to limit the decreasing switching on and switching off control current to the set minimum value. The reduction of the switching on and, respectively, switching off control current to the minimum value is preferably performed in a manner proportional to the change in the voltage, which approaches zero, at the freewheel semiconductor component. The minimum value of the current is in this respect so selected that the freewheel semiconductor component has the necessary switching time available for it.

For the reduction of the switching times a contribution is made more particularly by means for switching over the switching on and/or switching off current source to a substantially higher amount of the control current after the performance of switching over of the freewheel semiconductor component. The switching on and/or switching off current source will in this respect possess, in accordance with a particularly preferred embodiment of the invention, at least two part current sources, able to be switched alternatively by positive or negative voltages at the freewheel semiconductor component. For this purpose it is convenient to employ inversely connected diodes connected in accordance with the control input terminals of the current sources.

The shortest possible switching on time is preset by the unavoidable switching off delay time (see FIG. 3 (b), time period t6 to t8). A further reduction in the output side load voltage on the basis of the shortening of switching on time is consequently not possible. If nevertheless smaller output voltages are to be achieved than would be allowed by the shortest possible switching on time, this may be achieved in an advantageous fashion by using means which preset a switching on control current which does not completely turn on the semiconductor switch, if the output side load voltage goes below a preset fraction of the supply voltage. The voltage difference will then be across the transistor, which is then not completely turned on. The output voltage may because of this then assume very low values so that a regulator, which sets the pulse width, may set output voltages, which are smaller than could be obtained by having the shortest possible switching on time.

A convenient embodiment is one in which a comparison device is provided for comparison of the supply voltage with a voltage dropping across at least one of the loads, such comparison device setting the amount of the control current after performance of switching over of the freewheel semiconductor component in a manner dependent on the ratio between such voltages.

The semiconductor switch is conveniently a MOSFET or an IGBT semiconductor switch, but however the same problems occur in the case of bipolar transistors as well, which are similarly controlled using a base current as is described in the initially mentioned prior art.

The control input of the semiconductor switch is conveniently preceded by a two-way switch able to be controlled by a control signal for its respective switching operation, for switching over between the switching on and switching off current source. In this respect the control signal can conveniently be a pulse width modulated signal. However it is also possible to use the control signal directly for control of the switching on and switching off current source alternatively.

BRIEF DESCRIPTION OF THE DRAWING

Two embodiments of the invention are depicted in the drawings and described in the following account in detail.

DETAILED DESCRIPTION OF THE PREFERRED EMBODIMENT

Figure 1:
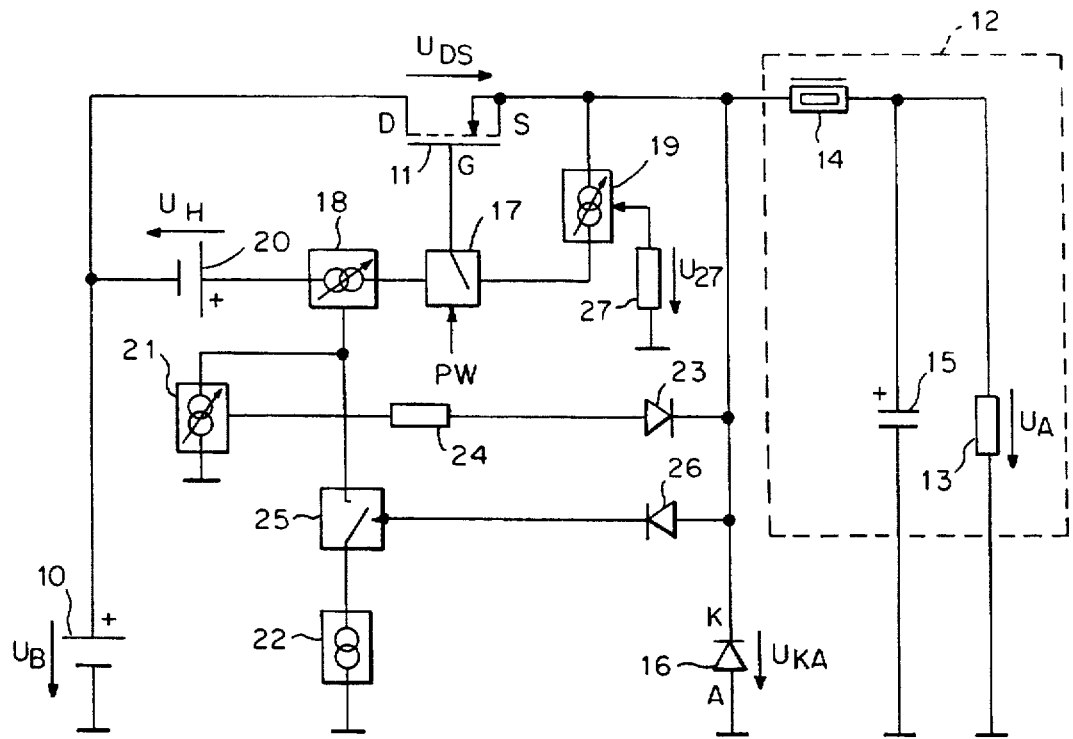
FIG. 1 shows a diagrammatic view of a first embodiment.

In the first embodiment of the invention illustrated in FIG. 1 a supply voltage source 10 with the supply voltage $U_B$, the DRAIN-SOURCE path of a transistor 11 in the form of MOSFET and a load arrangement 12 constitute a power circuit. In series with a load 13 an inductance 14 is connected, a capacitance 15 being connected in parallel with the load 13. This arrangement is to represent any desired load with ohmic, capacitive and inductive fractions. The inductance 14 it may for example be a coil, i.e. an inductive winding, but however such an inductance may also alone be due to the inductance of the wires of the power circuit or load resistors with an inductive fraction. Across the load there is a load voltage drop of $U_A$, whereas across the DRAIN-SOURCE path of the transistor 11 there is the DRAIN-SOURCE voltage drop $U_{DS}$.

Parallel to the load arrangement 12 a freewheel diode 16 is connected. It would also be possible to employ any other freewheel semiconductor component, as for example a unipolar transistor or a rectifier diode in the magnetically or transformer coupled load circuit. The GATE G (control terminal) of the transistor 11 is driven via a two-way switch device 17 by means of a pulse width modulated signal sequence PW in such a manner that for switching on the transistor 11 the GATE G is connected with a switching on current source 18 and for switching off the transistor 11 it is connected with a switching off current source 19, which for supply is connected with the SOURCE terminal S of the transistor 11. For power supply of the switching on current source 18 use is made of a series circuit arrangement comprising the supply voltage source 10 and an auxiliary voltage source 20, whose auxiliary voltage $U_H$ is added to the supply voltage $U_B$. For instance in the case of an N channel MOSFET, which is placed in circuit as a SOURCE follower, the GATE voltage must, for switching on, become more positive than the supply voltage at the DRAIN terminal. Accordingly the auxiliary voltage source 20 is required in the present case, since its positive terminal is accordingly at the potential $U_B+U_H$.

As is seen in FIG. 1, the un-grounded terminal of the freewheel diode 16 is directly coupled to both the second terminal S of the transistor switch and one side of the turning-off current source (19). Therefore the voltage at the freewheel diode and at the second terminal S are the same in the embodiment shown in FIG. 1.

The switching one current source 18 is connected with two further auxiliary current sources 21 and 22. The auxiliary current source 21 is designed in the form of a controlled current source and is controlled by the voltage drop $U_{KA}$ occurring at the freewheel diode 16 via a diode 23 and a resistor 24 connected in series therewith. The second auxiliary current source 22 is an uncontrolled current source, which is connected via a controlled switch 25 with the switching on current source 18. The controlled switch 25 is also controlled by the voltage $U_{KA}$ via a diode connected inversely in relation to the diode 23. The two diodes 23 and 26 are so connected that when the freewheel diode 16 is conducting and the negative flow voltage is $-U_{KA}$ the controlled switch 25 is turned off and the auxiliary current source 21 is set at a particular current value. In the other case, that is to say with a positive voltage at the cathode of the freewheel diode 16, the controlled switch 25 will be closed and the auxiliary current source 21 will be turned off. The currents supplied by the auxiliary current sources 21 and 22 to the switching on current source 18 either serve as control currents for control of the output current of such switching on current source 18, or they are added to a minimum current $I_{GSmin}$ produced by the switching on current source 18.

The switching off current source 19 is also designed in the form of a controlled current source and is controlled by a voltage $U_{27}$ dropping across a resistor 27. The voltage $U_{27}$ corresponds to the voltage $U_{KA}$. For this purpose the resistor 27 is for example so connected with the switching off current source 19 that it is practically parallel to the freewheel diode 16.

Figure 3:
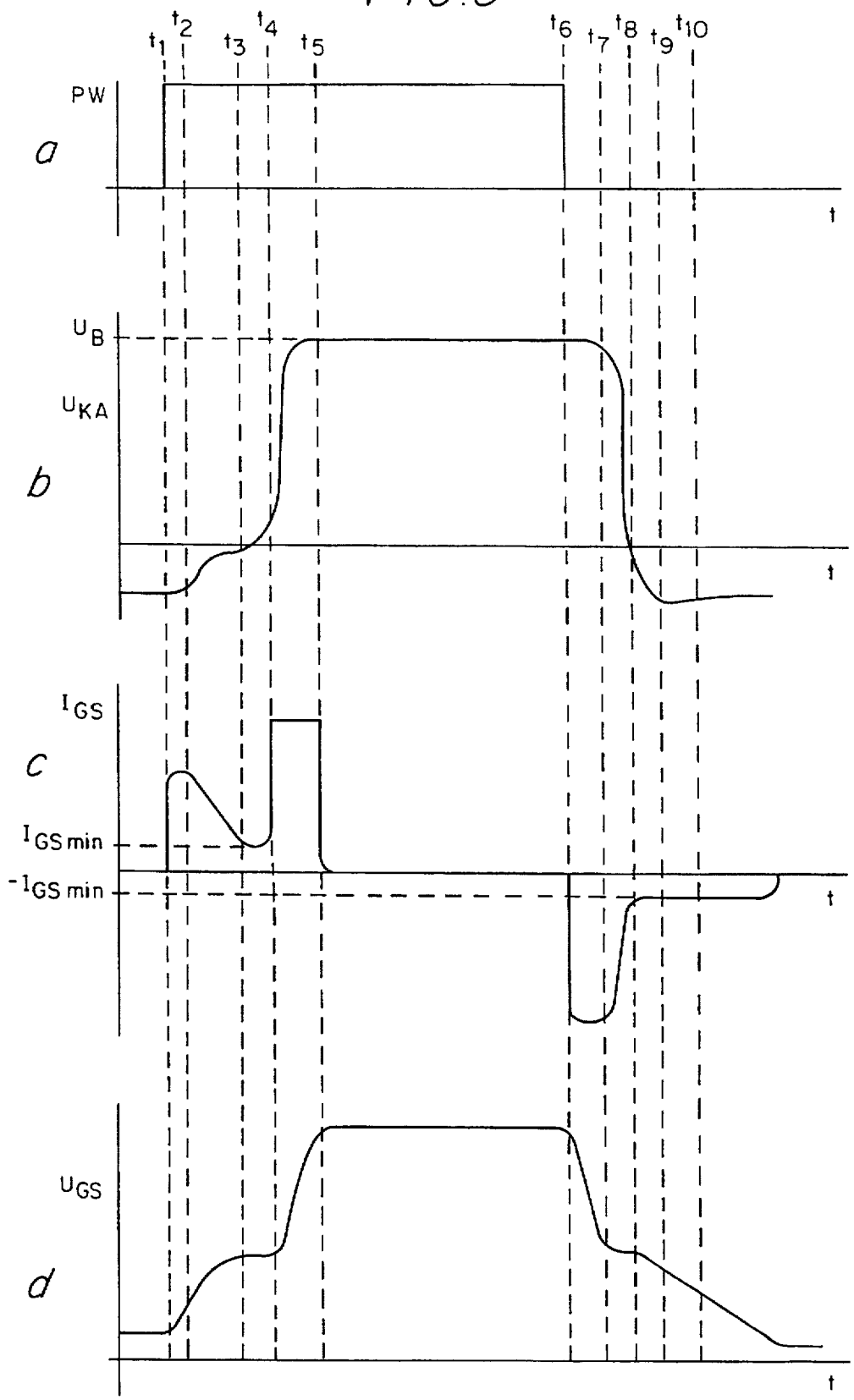
FIG. 3 shows a signal chart for explaining the manner of operation of the invention.

The manner of operation of the working embodiment depicted in FIG. 1 will now be described in the following with reference to the signal chart depicted in FIG. 3. First the switching on of the transistor 11 will be explained, which takes place in the time t1 through t5. If at the point t1 in time the pulse width modulated signal sequence PW changes from logical 0 to logical 1, the GATE G will be connected via the two-way switch device 17 with the switching on current source 18 and accordingly the switching on operation will be started. At this point in time the freewheel diode 16 is conducting and has a high negative flow voltage—$U_{KA}$. The diode 26 is accordingly turned off and the diode 23 is conducting. A current flows through the resistor 24 in a manner dependent on the flow voltage dropping across the freewheel diode 16, such current constituting a control quantity for the output current of the auxiliary current source 21. The proportional link between the control current and the flow voltage is represented by the resistor 24. The switching on current $I_{GS}$, which flows from the switching on current source 18 to the GATE of the transistor 11, is set at the point t1 in time by the high control flow current of the auxiliary current source 21 to a high value, since the flow voltage $-U_{KS}$ has a high negative value at this time. Due to the high switching on current $I_{GS}$ the voltage $U_{GS}$, i.e. the GATE-SOURCE voltage, of the transistor 11 will rapidly increase (see FIG. 3(d)). If voltage $U_{GS}$ exceeds the trip voltage of the transistor 11, the current through it will increase with the result that the current through the freewheel diode 16 will be correspondingly reduced. The flow voltage $-U_{KA}$ will therefore become smaller. In accordance with the reduction in the flow voltage $-U_{KA}$ of the freewheel diode 16 there will be a reduction also in the control current for the auxiliary voltage source 21 during the time 22 till t3. At the point t3 in time the flow voltage $-U_{KA}$ will be so reduced that the freewheel diode 16 is near the switch point. The control quantity for the auxiliary current source 21 is accordingly reduced practically to zero and current through the switching current source 18 will only be the permanently set minimum current $I_{GSmin}$, whose level is so selected that there is the necessary switching over time (t3 through t4) for the freewheel diode 16.

At the point t4 in time the critical range of the switching over operation of the freewheel diode 16 is terminated and same will have assumed a positive turnoff voltage $U_{KA}$. The diode 23 is now turned off and the diode 26 is conducting and via the switch 25 turns on the second auxiliary current source 22, which sets the switching on current $I_{GS}$ at a high value with the result that the switching on operation, which is now uncritical, of the transistor 11 is rapidly concluded by the point t5 in time.

During the time t2 to t4 due to the current flowing through it and the high voltage $U_{DS}=U_B+U_{AK}$ a high power dissipation takes place in the transistor 11. As indicated in the description in conjunction with the signal chart of FIG. 3, this time is substantially reduced to be lower than in the prior art without any additional interference power resulting.

At the point t6 in time switching off of the transistor 11 is started by the signal of the pulse width modulated signal sequence PW changing from logical 1 to logical 0. Consequently the GATE of the transistor 11 is connected via the two-way switch device 17 with the switching off current source 19. The voltage $U_{DS}$ at the transistor 11 is extremely small in the switched on state of this transistor so that the voltage $U_{KA}$ (equal to $U_{27}$) is substantially the same as the supply voltage $U_B$, that is to say it is very high. The switching off current source 19 is accordingly set to a high switching off current—$I_{GS}$. This current reduces the voltage $U_{GS}$ so that the resistance of the transistor increases during the time t6 to t7. At the point t7 in time the resistance of the DRAIN-SOURCE path of the transistor 11 will have reached a value, which on further reduction in $U_{GS}$ will lead to a corresponding increase in the voltage $U_{DS}$. Accordingly the voltage $U_{KA}$ at the freewheel diode 16 will be reduced to the same extent and with it therefore also the voltage $U_{27}$ so that the switching off current—$I_{GS}$ will be reduced in a manner proportional to the reduction in the voltage $U_{KA}$ and at the point t8 in time will reach the minimum current—$I_{GSmin}$ which is set in the switching off current source 19, and which is substantially equal in amount to the minimum current of the switching on current source 18. The voltage $U_{KA}$ (equal to $U_{27}$) is at this point in time substantially zero. t9 to t10 is the time which the freewheel diode 16 requires in order to take over the current due to the inductance 14 completely. At the point t10 in time the switching off operation is completed.

The problematical, unavoidable and undesired switching times of the freewheel diode are on the one hand due to the diode itself and on the one hand due to undesired inductive effects in the switching off lines and to capacitors and things causing high frequency oscillations and voltage peaks (interference voltages). The switching times are so set by the arrangement described that the undesired effects practically cease to occur and electromagnetic compatibility is ensured.

Figure 2:
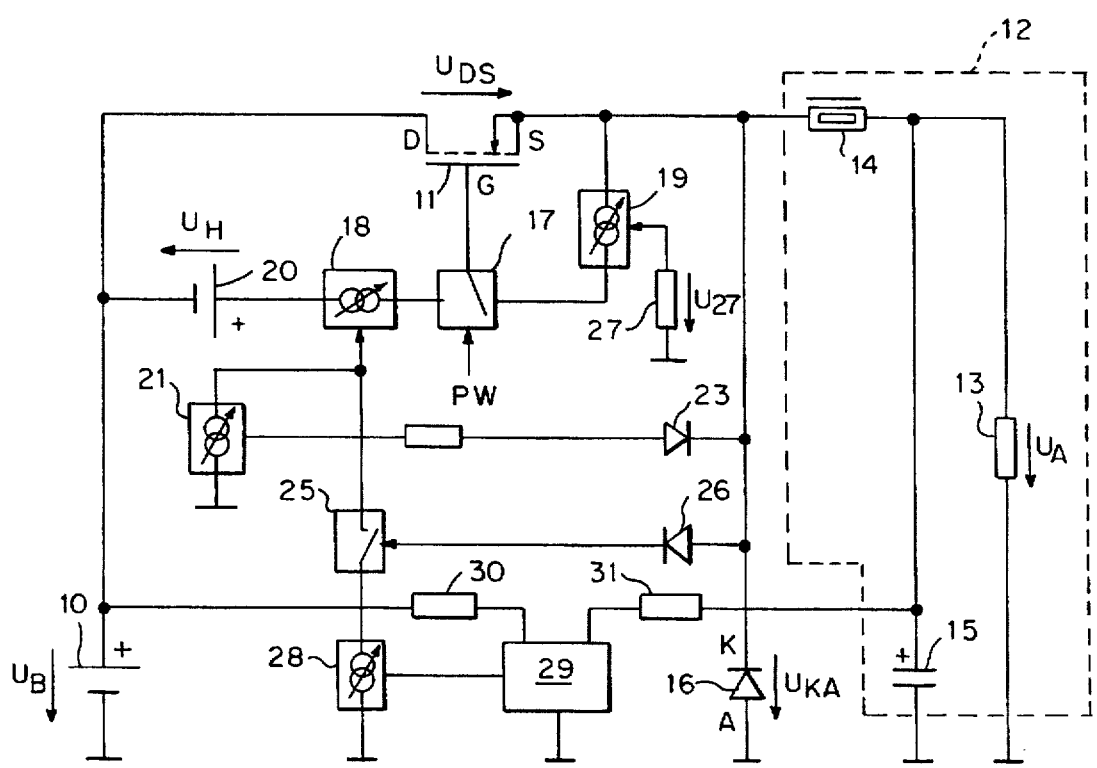
FIG. 2 shows the circuit of a second embodiment of the invention, which includes a comparison device for further reduction of the load voltage not included in the first embodiment.

The second embodiment depicted in FIG. 2 is in many respects the same as the first embodiment. Accordingly identical or identically functioning components and subassemblies are consequently provided with the same reference numerals and not described over again. In contradistinction to the first embodiment the auxiliary current source 22 is replaced by a controlled auxiliary current source 28 which is controlled by a comparison device 29. The output control quantity of the comparison device 29 is based on the comparison between the voltages $U_B$ and $U_A$ at the load 13 or, respectively, at the load arrangement 12. These two voltages $U_B$ and $U_A$ are supplied to the comparison device 29 via two resistors 30 and 31. The current of the auxiliary current source 28 is then changed to assume lower values, if a certain ratio $U_A/U_B$ is gone below, such ratio being set by the resistance ratio R/n.R. In this respect the resistor 31 has the value R and the resistor 30 has the resistance value of n.R. At a pulse width of 5% n is for example 20.

The shortest possible switching on time of the transistor 11 at an extremely low pulse width ratio is preset by the unavoidable switching delay time (FIG. 3(b) t6 to t8). A further reduction in the voltage $U_A$ is therefore not possible by a having a further reduction in the switching on time. If nevertheless smaller output load voltages $U_A$ are to be achieved than would be permitted by the shortest possible switching on time, this can only be ensured by having a voltage reduction at the SOURCE terminal of the transistor 11 during the switching on time of this transistor, that is to say during time t4 through t5. The difference in voltage must then however be a drop across the transistor 11, which for this purpose is now no longer completely turned on. This is achieved by the arrangement referenced 28–31.

In the case of longer switching on times the auxiliary current source 28 has the same function as the auxiliary voltage source 22 in accordance with FIG. 1. When the ratio of the voltages $U_A/U_B$ is however smaller than the resistance ratio R/n.R at the point t4 in time the control action of the comparison device 29 on the auxiliary current source 28 is to have smaller lower current values. Accordingly there is a reduction in the switching on current $I_{GS}$ and the time for the complete switching on of the transistor 11 is correspondingly extended. A further reduction in the output load voltage $U_A$ will have the consequence that the comparison device 29 can reduce the current of the auxiliary current source 28 to a value of zero with the result that the switching on current $I_{GS}$ is reduced till it reaches the value $I_{GSmin}$. At a short switching on time, which is near the minimum possible switching on time, the transistor accordingly comes to have small conductivity values so that during such switching on time the voltage drop across same is equal to the voltage reduction at its SOURCE terminal. The output voltage $U_A$ can hence assume extremely low values so that a regulator, which is responsible for the pulse width, can be set for output voltages, which are smaller than could actually be produced by having the shortest possible switching on time.

The measures in accordance with the invention are applicable both in the case of switching power supplies with a high side switch or a low side switch and also for magnetically coupled switching power supplies. The transistor 11 can be a MOSFET (of the N channel or P channel type) or an IGBT transistor. A corresponding application with bipolar transistors (npn or pnp types) is feasible as well, as is explained in connection with the prior art noted in the introduction hereto.

In a modification of the embodiment described the maximum possible switching off current—$I_{GS}$ may also be limited. It is only when a voltage $U_{27}$ corresponding to this limit value at the resistor 27 is gone below that the switching off current is then continuously reduced, for example proportionally.

In order to render the switching on operation more rapid the switching on current is substantially increased after the switching on operation of the freewheel diode 16 during time interval t4 to t5, as has been described in connection with FIG. 1. In a corresponding fashion on switching off the transistor 11 as well the switching off current—$I_{GS}$ can be substantially increased after switching over the freewheel diode 16 in order to more rapidly turn off the transistor 11 completely. This increase in current after the switching over operation at the freewheel diode 16 can take place on switching on and on switching off the transistor 11 also in an analogous manner continuously instead of the step-wise increase as described.

In the embodiments of the invention the switching on and switching off current $I_{GS}$ is continuously reduced from an initially increased value in a manner dependent on the voltage drop at the freewheel diode 16 and is more particularly proportionally reduced. Instead of taking place in a manner dependent on the voltage $U_{KA}$ at the freewheel diode 16, this reduction in current may be performed as well in a manner dependent on parameters, which are dependent on this voltage $U_{KA}$ or which vary in accordance with this voltage. For instance it is possible for the current change to take place in a fashion dependent on the decreasing flow voltage or on the decreasing flow current of the transistor 11.

What is claimed is:

1. A control circuit for turning off a flow of direct current through a load (12) to ground, the load being at least partly an inductive load (14); the control circuit comprising:

a semiconductor switch (11) having a first terminal (D), a control terminal (G), and a second terminal (S) coupled to the load;

a semiconductor freewheel component (16) coupled between the second terminal and ground in parallel with the load, the freewheel component having a current-conducting state and a current non-conducting state;

a switching-off current source (19), coupled between the second terminal and the control terminal, comprising means to reduce a magnitude of switching control current ($-I_{GS}$) flowing through the control terminal of the switch as a function of voltage at the second terminal of the switch;

the function including a minimum value ($-I_{GSmin}$) of the switching control current being reached when the voltage at the second terminal of the switch is at ground potential;

whereby when the load is disconnected the control current is reduced from a higher initial value so as to open the semiconductor switch completely only when the freewheel component is in the current-conducting state.

2. The control circuit according to claim 1, wherein the switching-off current source comprises a limiting device for limiting the switching control current to at least the minimum value.

3. The control circuit according to claim 1, wherein the means to reduce the magnitude of the switching control current ($-I_{GS}$) reduces the magnitude substantially in proportion to a change of voltage at the freewheel component.

4. The control circuit according to claim 1, wherein the minimum value ($-I_{GSmin}$) of the switching control current is predetermined to accommodate a necessary switching-over time of the freewheel component.

5. A control circuit for turning on a flow of direct current through at least one load (12) to ground, the load being at least partly an inductive load (14); the control circuit comprising:

a semiconductor switch (11) having a first terminal (D), a control terminal (G), and a second terminal (S) coupled to the load;

a semiconductor freewheel component (16) coupled between the second terminal and ground in parallel with the at least one load, the freewheel component having a current-conducting state and a current non-conducting state;

a switching-on current source (18), coupled between the first terminal and the control terminal, comprising means to set a magnitude of switching control current ($I_{GS}$) flowing through the control terminal of the switch as a function of voltage at the second terminal of the switch;

the function including a minimum value ($I_{GSmin}$) of the switching control current being reached when the voltage at the second terminal of the switch is at ground potential prior to going below a threshold value thereof;

whereby when the load is disconnected the control current is reduced from a higher initial value so as to open the semiconductor switch completely only when the freewheel component is in the current non-conducting state.

6. The control circuit according to claim 5, wherein the switching-on current source comprises a limiting device for limiting the switching control current to at least the minimum value.

7. The control circuit according to claim 5, wherein the means to set the magnitude of the switching control current ($I_{GS}$) reduces the magnitude substantially in proportion to a change of voltage at the freewheel component.

8. The control circuit according to claim 5, wherein the minimum value ($I_{GSmin}$) of the switching control current is predetermined to accommodate a necessary switching-over time of the freewheel component.

9. The control circuit as claimed in claim 5, including means (22, 25 and 26) for switching over the switching on current source (18) to a substantially higher amount of the control current after switching over the freewheel semiconductor component (16) has been completed.

10. The control circuit according to claim 5, wherein the switching-on current source (18) further comprises:

a first current source part (21) and a second current source part (22); and selective means for enabling the first current source part when a voltage at the freewheel component is negative and for enabling the second current source part when the voltage at the freewheel component is positive; whereby the first current source part and the second current source part are alternatively switched by positive and negative voltages at the freewheel component.

11. The control circuit according to claim 10, comprising a first diode coupled between the freewheel component and the first current source part (21) and a second diode coupled between the freewheel component and the second current source part (22); and wherein the first diode and the second diode are inversely connected to the freewheel component.

12. The control circuit as claimed in claim 5, including means (28 through 31) which when the output load voltage ($U_A$) is gone below by a preset fraction of the supply voltage ($U_B$) provide a switching on control current which almost completely switches on the semiconductor switch (11).

13. The control circuit as claimed in claim 12, including a comparison circuit (29) means for comparison of the supply voltage ($U_B$) with the voltage ($U_A$) drop at one of the loads at least, wherein the comparison device (29) sets the amount of the control current ($I_{GS}$) after switching over of the freewheel semiconductor component (16) in a fashion dependent on the ratio of such voltages to each other.

14. The control circuit as claimed in claim 5, including the semiconductor switch (11) is a MOSFET or an IGBT semiconductor switch.

15. The control circuit as claimed in claim 5, including a two-way switch (17) placed on the input side of the control terminal of the semiconductor switch (1), the two-way switch (17) being able to be controlled by a control signal (PW) for its respective switching operation, for switching over between the switching on and switching off current source.

16. The control circuit as claimed in claim 5, wherein the switching on and the switching off current source comprise inputs able to be operated by a control signal (PS) for alternatively switching on and switching off thereof.

17. The control circuit as claimed in claim 15, wherein the control signal (PS) is a pulse width modulated signal.

* * * * *